United States Patent
Wenzel et al.

(10) Patent No.: US 6,891,174 B2
(45) Date of Patent: May 10, 2005

(54) METHOD AND SYSTEM FOR ION BEAM CONTAINMENT USING PHOTOELECTRONS IN AN ION BEAM GUIDE

(75) Inventors: Kevin W. Wenzel, Belmont, MA (US); Bo H. Vanderberg, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 62 days.

(21) Appl. No.: 10/632,234

(22) Filed: Jul. 31, 2003

(65) Prior Publication Data

US 2005/0023487 A1 Feb. 3, 2005

(51) Int. Cl.[7] .............................................. H01J 37/317
(52) U.S. Cl. ............................. 250/492.21; 250/423 R; 250/423 P; 250/492.3
(58) Field of Search ...................... 250/492.21, 423 R, 250/423 P, 492.3; 315/111.81

(56) References Cited

U.S. PATENT DOCUMENTS

| | | |
|---|---|---|
| 4,383,177 A | 5/1983 | Keller et al. |
| 4,447,732 A | 5/1984 | Leung et al. |
| 4,686,365 A | 8/1987 | Meek et al. |
| 4,714,860 A * | 12/1987 | Brown et al. ............ 315/111.81 |
| 4,780,642 A | 10/1988 | Jacquot |
| 5,206,516 A | 4/1993 | Keller et al. |
| 5,350,926 A | 9/1994 | White et al. |
| 5,433,788 A | 7/1995 | Mochizuki et al. |
| 5,497,006 A | 3/1996 | Sferlazzo et al. |
| 5,523,652 A | 6/1996 | Sferlazzo et al. |
| 5,554,857 A | 9/1996 | Benveniste |
| 5,576,538 A | 11/1996 | Sakai et al. |
| 5,661,308 A | 8/1997 | Benveniste et al. |
| 5,703,372 A | 12/1997 | Horsky et al. |
| 5,703,375 A | 12/1997 | Chen et al. |
| 5,707,452 A | 1/1998 | Dandl |
| 5,750,987 A | 5/1998 | Ichimura et al. |
| 5,760,405 A | 6/1998 | King et al. |
| 5,811,823 A | 9/1998 | Blake et al. |
| 5,825,038 A | 10/1998 | Blake et al. |
| 5,834,786 A | 11/1998 | White et al. |
| 5,925,886 A | 7/1999 | Seki et al. |
| 5,975,014 A | 11/1999 | Dandl |
| 6,016,036 A | 1/2000 | Brailove |

(Continued)

FOREIGN PATENT DOCUMENTS

| | | | | |
|---|---|---|---|---|
| JP | 05-205691 | * | 8/1993 | .......... H01J/37/317 |
| JP | 406036735 A | | 2/1994 | |
| JP | 06-089690 | * | 3/1994 | .......... H01J/37/317 |
| JP | 7-340297 | | 12/1995 | |

OTHER PUBLICATIONS

"Work Functions of the Elements [eV]", After L. Ley and M. Cardona, Photoemisison in Solids, Springer 1979, 1 pg..
"Acceleration and Transport of Neutralized Ion Beams", Charged Prticle Beams, A Wiley–Interscience Publication, Stanley Humphries, Jr., 1990, 7 pgs.
"Space–Charge Neutralization and Studies of the Beam Plasma", Bernard Peters, A. C. Helmholz and W. E. Parkins, Definition and Description of the Beam–Plasma Region, Book Title Unknown, Date Unknown, 14 pgs.

(Continued)

*Primary Examiner*—John R. Lee
*Assistant Examiner*—Anthony Quash
(74) *Attorney, Agent, or Firm*—Eschweiler & Associates, LLC

(57) ABSTRACT

Ion implantation systems and beam containment apparatus therefor are provided in which a photoelectron source and a photon source are provided along a beam path. The photon source, such as a UV lamp, provides photons to a photoemissive material of the photoelectron source to generate photoelectrons for enhanced beam containment in the ion implantation system.

49 Claims, 14 Drawing Sheets

U.S. PATENT DOCUMENTS

| | | | |
|---|---|---|---|
| 6,060,718 A | 5/2000 | Brailove et al. | |
| 6,100,536 A | 8/2000 | Ito et al. | |
| 6,130,436 A | 10/2000 | Renau et al. | |
| 6,135,128 A | 10/2000 | Graf et al. | |
| 6,207,963 B1 | 3/2001 | Benveniste | |
| 6,207,964 B1 | 3/2001 | McIntyre et al. | |
| 6,242,750 B1 | 6/2001 | Takahashi et al. | |
| 6,271,529 B1 | 8/2001 | Farley et al. | |
| 6,294,862 B1 | 9/2001 | Brailove et al. | |
| 6,297,594 B1 | 10/2001 | Sakai et al. | |
| 6,313,475 B1 | 11/2001 | Renau et al. | |
| 6,359,286 B1 | 3/2002 | Ito et al. | |
| 6,414,329 B1 | 7/2002 | Benveniste et al. | |
| 6,515,408 B1 | 2/2003 | England et al. | |
| 6,541,781 B1 | 4/2003 | Benveniste et al. | |
| 2002/0014587 A1 | 2/2002 | Benveniste et al. | |

OTHER PUBLICATIONS

"A Noncontacting Scanning Photoelectron Emission Technique for Bonding Surfaces Cleanliness Inspection", Dr. Raymond L. Gause, presented of the Fifth Annual NASA NDE Workshop, Cocoa Beach, Florida, Date unknown, 16 pages.

"Lowering the Work Function of a Photoemissive Electrode", Dieter W. Blum, The QTI Group, Applied Electrodynamics, Sep., 2000, 7 pgs.

\* cited by examiner

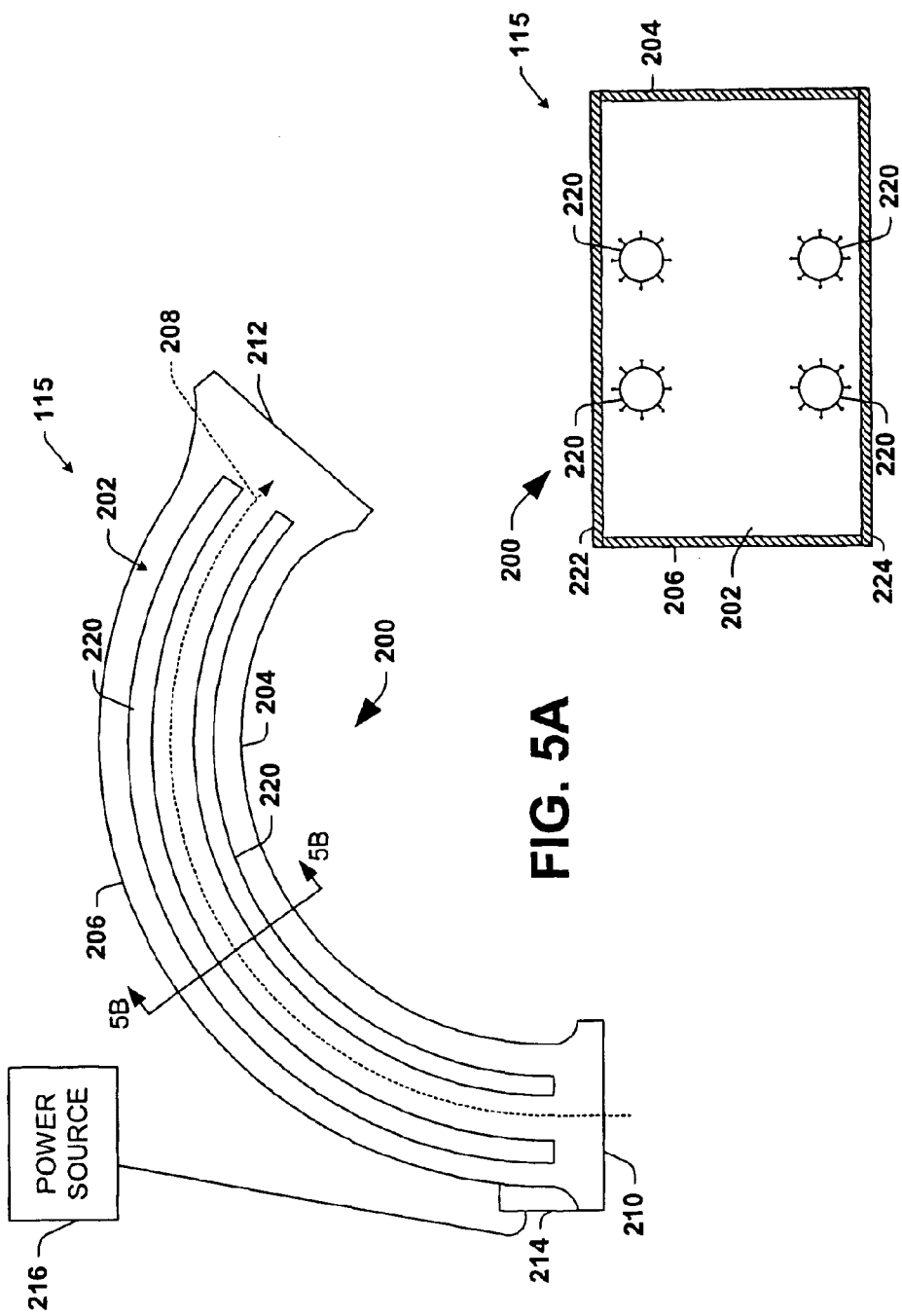

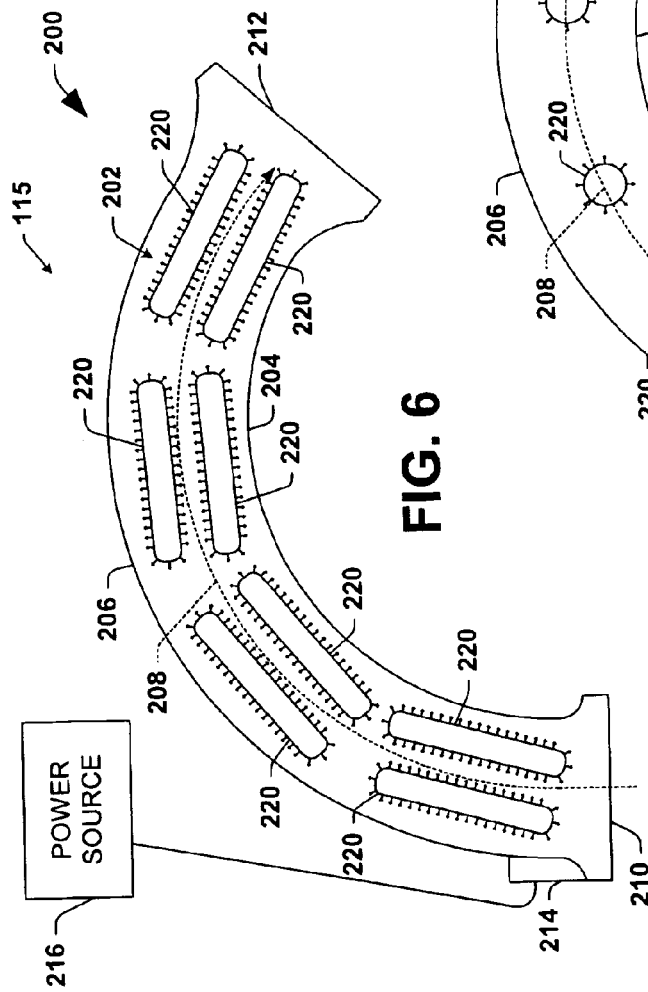
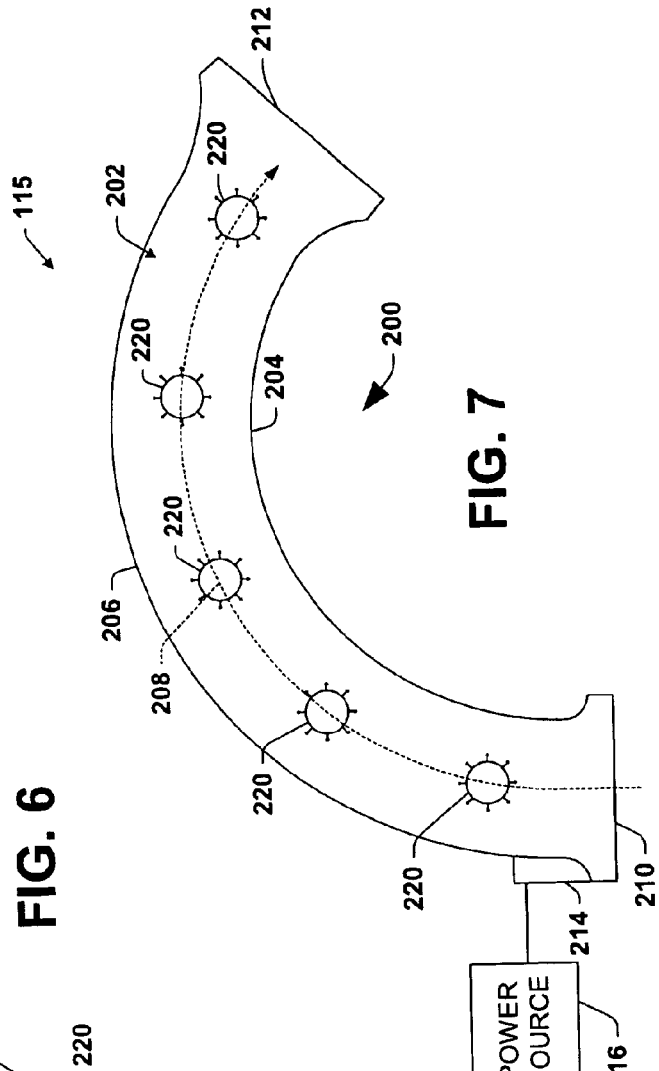

METHOD AND SYSTEM FOR ION BEAM CONTAINMENT USING PHOTOELECTRONS IN AN ION BEAM GUIDE

FIELD OF THE INVENTION

The present invention relates generally to ion implantation systems, and more specifically to improved methods and apparatus for ion beam containment and transport in an ion implantation system.

BACKGROUND OF THE INVENTION

In the manufacture of semiconductor devices, ion implantation is used to dope semiconductor wafers with impurities. Ion implanters or ion implantation systems treat semiconductor wafers with an ion beam, to produce n or p-type doped regions or to form passivation layers in the wafers during fabrication of integrated circuits. When used for doping semiconductors, the ion implantation system injects a selected ion species to produce the desired extrinsic material. Implanting ions generated from source materials such as antimony, arsenic or phosphorus results in n type extrinsic material wafers, whereas if p type extrinsic material wafers are desired, ions generated with source materials such as boron, gallium or indium may be implanted. Ion implanters are also used for other applications in the manufacture of semiconductor devices that require implanting additional species. For example, germanium is implanted into silicon wafers to preamorphize the silicon and prevent ion channeling in subsequent implantation steps.

Ion implantation systems typically include an ion source for generating positively charged ions from such ionizable source materials. The generated ions are extracted from the source and formed into an ion beam, which is directed along a predetermined beam path in a beamline assembly to an implantation station, sometimes referred to as an end station. The ion implantation system may include beam forming and shaping structures extending between the ion source and the end station, which maintain the ion beam and bound an elongated interior cavity or passageway through which the beam is transported en route to one or more wafers or workpieces supported in the end station. The ion beam transport passageway is typically evacuated to reduce the probability of ions being deflected from the predetermined beam path through collisions with air molecules.

The charge-to-mass ratio of an ion affects the degree to which it is accelerated both axially and transversely by electric or magnetic fields. Ion implantation systems typically include a mass analyzer in the beamline assembly downstream of the ion source, having a mass analysis magnet creating a dipole magnetic field across the beam path in the passageway. This dipole field operates to deflect various ions in the ion beam via magnetic deflection in an arcuate section of the passageway, which effectively separates ions of different charge-to-mass ratios. The process of selectively separating ions of desired and undesired charge-to-mass ratios is referred to as mass analysis. Using mass analysis techniques, the beam imparted on the wafer can be made very pure since ions of undesirable molecular or atomic weight will be deflected to positions away from the beam path and implantation of other than desired materials can be avoided.

High energy ion implantation is commonly employed for deeper implants in a semiconductor wafer. Conversely, high current, low energy ion beams are typically employed for high dose, shallow depth ion implantation, in which case the lower energy of the ions commonly causes difficulties in maintaining convergence of the ion beam. In particular, high current, low energy ion beams typically include a high concentration of similarly charged (positive) ions which tend to diverge due to mutual repulsion, a space charge effect sometimes referred to as beam blowup. Beam blowup is particularly troublesome in high current, low energy applications because the high concentration of ions in the beam (high current) exaggerates the force of the mutual repulsion of the ions, while the low propagation velocity (low energy) of the ions expose them to these mutually repulsive forces for longer times than in high energy applications. Space Charge Neutralization is a technique for reducing the space charge effect in an ion implanter through provision and/or creation of a beam plasma, comprising positively and negatively charged particles as well as neutral particles, wherein the charge density of the positively and negatively charged particles within the space occupied by the beam are approximately equal. For example, a beam plasma may be created when the positively charged ion beam interacts with residual background gas atoms, thereby producing ion electron pairs through ionizing collisions during beam transport. As a result, the ion beam becomes partially neutralized through interaction with the background residual gas in the beam path.

The ion beam typically propagates through a weak plasma that is a byproduct of the beam interactions with the residual or background gas. A plasma has the property that it shorts out electric fields in very short distances due to the high mobility of the electrons. The plasma therefore tends to neutralize the space charge caused by the ion beam by providing negatively charged electrons along the beam path in the passageway, thereby largely eliminating transverse electric fields that would otherwise disperse or blow up the beam. However, at low ion beam energies, the probability of ionizing collisions with the background gas is very low. Consequently, little or no space charge neutralization of low-energy beams occurs in implanters as a result of plasma produced by beam interactions with residual gas. In the dipole magnetic field of a mass analyzer, moreover, plasma diffusion across magnetic field lines is greatly reduced while the diffusion along the direction of the field is unrestricted. As a result, introduction or maintenance of additional plasma for space charge neutralization is difficult in the mass analyzer portion of an implanter, since such plasma is quickly diverted along the dipole magnetic field lines to the passageway sidewalls. In addition, low energy implantation systems typically suffer from electrons being lost to the sidewalls along the beamline assembly, which reduces the number of such electrons available for space charge neutralization.

Furthermore, in scanned-beam systems where an ion beam is scanned using alternating electric or magnetic fields, plasma generation is difficult because of the time-varying nature of plasma diffusion through such fields. Such systems often include scanning apparatus for scanning the ion beam in one direction while the target wafer or wafers are scanned in an orthogonal direction to provide for uniform implantation of the target wafers. The beam is typically scanned at some point along the beamline using varying electric or magnetic fields, and focusing apparatus (e.g., sometimes referred to as a parallelizer) is provided downstream of the scanning apparatus to make the scanned beam parallel. For low energy high current beams, magnetic fields are preferred for scanning and parallelizing the beam. However, the time-varying scanning makes beam confinement through beam-generated plasma difficult, wherein the beam moves away from the spatial location where plasma is being generated. Thus, the density of beam-generated plasma within the volume the beam is moving into is much lower than the plasma density in the volume the beam is moving out of. Thus, there is a need for scanned and non-scanned beam ion implantation systems and methods for enhancing space charge neutralization and preventing or reducing beam blowup.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor to delineate the scope of the invention. Its purpose, rather, is to present some concepts of the invention in a simplified form as a prelude to the more detailed description that is presented later.

The present invention is related to beam confinement and transport in ion implantation systems through space charge neutralization. Photoemission is employed to generate electrons to neutralize the space charge of an ion beam during transport to confine the beam along the beam path and to inhibit or prevent beam divergence or blowup. The invention is particularly useful in high current, low energy implanters, but also finds utility in implantation systems generally, including high energy implanters. In this regard, the invention may be employed in conjunction with the transport of ion beams of any energy and form factor, such as low or ultra-low energy ion beams having circular or elongated profiles (e.g., "pencil" beams and/or ribbon beams) or beams of other shapes, including scanned and/or fixed (e.g., non-scanned) beams. Generation of photoelectrons is accomplished by providing photons from a lamp or other photon source in the implanter to a beamguide wall or other photoelectron source, wherein such photoelectron emission may be provided along all or a portion of a beam path between an ion source and an end station, including the portion of the beam path passing through a mass analyzer. The photoelectron source may be biased to enhance photoemission and/or to facilitate attraction of the generated photoelectrons toward the ion beam, wherein a grounded shield may be employed to limit the effect of the biasing on the beam. Alternatively or in combination, magnetic fields may be provided to enhance the photoemission process.

In one aspect of the invention, ion implantation systems and beam confinement apparatus therefor are provided, comprising a photoelectron source located along at least a portion of an ion beam passageway, as well as a photon source providing photons to at least a portion of the photoelectron source. This causes emission of photoelectrons from the photoelectron source which may then enhance the neutralization of the ion beam space charge. In one example, all or portions of one or more beamguide walls are used as the photoelectron source, wherein the photon source comprises one or more lamps, such as UV lamps, lasers, or other source located within or outside the beamguide to provide photons having energies exceeding the work function of the photoelectron source material. The beam confinement apparatus may further comprise a magnetic device adapted to provide multi-cusped magnetic fields in at least a portion of the passageway, and the photoelectron source may be biased to improve photoemission and to help direct the emitted electrons to the beam. Also, the photoelectron source and the photon source may be located so as to cooperatively provide photoelectrons in a portion of the beam passageway passing through a mass analyzer.

Another aspect of the invention relates to methods for providing ion beam containment in an ion implantation system, wherein the methods comprise providing a photoelectron source along an ion beam path, and providing photons to at least a portion of the photoelectron source to cause emission of photoelectrons from the photoelectron source. In one example, a beamguide wall or surface functions as a photoelectron source, wherein photons are provided to at least a portion of the beamguide to cause photoemission of photoelectrons for space charge neutralization and the resulting beam containment. The photons may be provided using one or more lamps or lasers located along the beam path to provide light (e.g., ultraviolet or other wavelength light) to the photoelectron source. The methods may further comprise providing multi-cusped magnetic fields at or near adjacent beamguide walls to enhance emission of photoelectrons and/or providing biasing of the photoelectron source to enhance photoemission.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

FIGS. 5A and 5B illustrate another exemplary beam confinement apparatus in the beamguide of the ion implantation system of FIGS. 3 and 4A in accordance with the invention;

FIGS. 6 and 7 are top plan views illustrating other exemplary beam confinement apparatus in accordance with the invention;

DETAILED DESCRIPTION OF THE INVENTION

Figure 1:
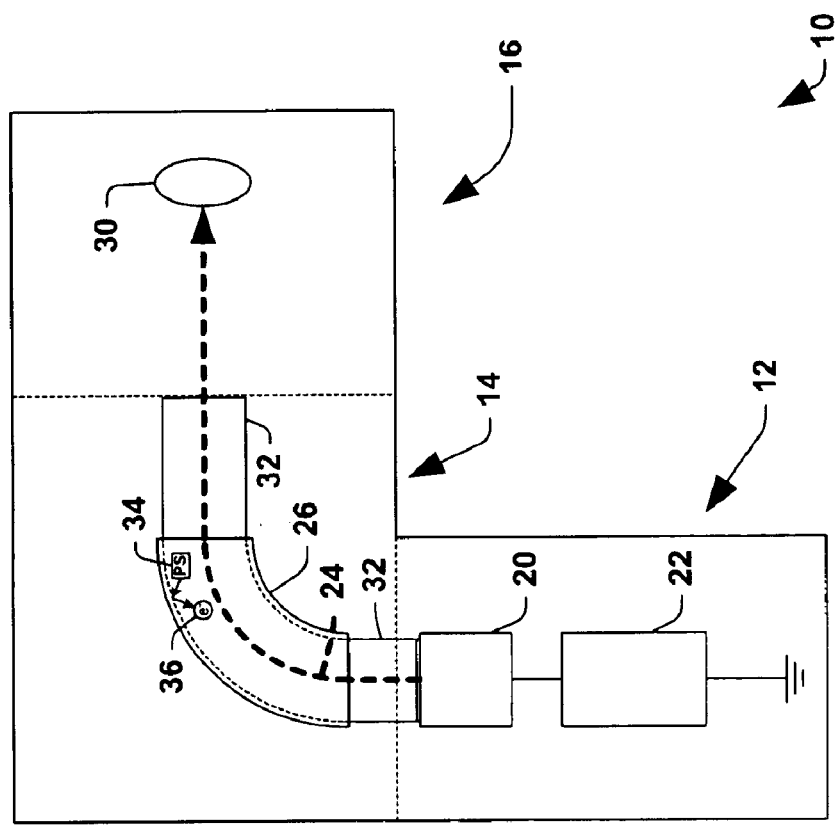
FIG. 1 is a simplified schematic diagram illustrating an exemplary low energy ion implantation system having beam confinement apparatus in accordance with an aspect of the present invention.

The present invention will now be described with reference to the drawings wherein like reference numerals are used to refer to like elements throughout. The present invention provides for beam containment or confinement in ion implantation systems, for example, low energy, high current implanters operated at low pressures, without requiring the introduction of plasma into the beamline assembly from an external plasma source, by enhancing the beam plasma using photoelectrons created in the implanter through photoemission. Several examples of low energy implantation systems and beamline assemblies therefor are hereinafter presented in order to illustrate the various aspects of the invention. However, it will be appreciated that the invention may be advantageously employed in ion implanter systems apart from those illustrated and described herein. For example, various exemplary implementations are illustrated and described hereinafter in the context of beam confinement apparatus located generally along the entire length of a beamline assembly beamguide situated between an ion source and an end station or a resolver housing upstream from the end station. Other implementations of the invention are possible within the scope of the appended claims, for example, wherein photon and photoelectron sources are situated anywhere along the beam path between the ion source and the end station, where the photon source may be within a beamguide or outside the beamguide, providing photons to the photoelectron sources in the beamguide interior via one or more transparent windows. In addition, the various aspects of the present invention may be carried out in association with high energy implanters, such as those including linear accelerator devices. Furthermore, although illustrated in association with batch type end stations, the invention may alternatively be carried out with other types of end stations, including but not limited to serial end stations in which a single wafer is implanted, wherein all such variant implementations are contemplated as falling within the scope of the appended claims.

The inventors have appreciated that ion beams propagating through a plasma, such as the beam plasma created by beam interactions with the residual or background gas, reach a steady state equilibrium at which charges produced by ionization and charge exchange may be lost to the beamguide walls in conventional ion implanters. The remaining plasma density results from a balance between charge formation due to ionizing collisions, and losses from the beam volume due to repulsion of positive charges by the residual space charge and electron escape as a result of kinetic energy. Absent plasma enhancement through the introduction of externally generated plasma or enhancement of the beam plasma, the probability for ionizing collisions with the background gas at very low ion beam energies is relatively low. Electrons generated in such a manner are trapped in the beam's large potential well, orbiting around and through the beam, interacting with each other by Coulomb collisions, resulting in thermalization of the electron energy distribution. Those electrons in the distribution having an energy greater than the ionization potential of a residual gas molecule have a probability of ionizing such a molecule. The ionizing probability decreases as the electron energy decreases. In a low energy beam plasma, the majority of the ionization is produced by the trapped electrons. These electrons derive their energy from acceleration by self-generated electric fields, which is the same mechanism that causes beam "blow-up". Thus, transportation of low energy ion beams is difficult absent externally generated plasma or enhancement of the beam plasma. Because mass analyzers inherently involve magnetic fields, externally generated plasma fails to diffuse adequately along the arcuate length of a mass analyzer beamguide, instead diffusing quickly along the direction of the magnetic field lines.

Referring initially to FIG. 1, the invention provides additional electrons for space charge neutralization through photoemission in ion implantation systems, in order to inhibit or avoid beam blowup. In FIG. 1, a simplified low energy ion implantation system 10 is schematically illustrated in accordance with the present invention, which comprises a terminal 12, a beamline assembly 14, and an end station 16. The terminal 12 comprises an ion source 20 powered by a high voltage power supply 22, that produces and directs an ion beam 24 (illustrated in dashed line in FIG. 1A) to the beamline assembly 14. The beamline assembly 14 comprises a beamguide 32 and a mass analyzer 26 in which a dipole magnetic field is established to pass only ions of appropriate charge-to-mass ratio to a wafer 30 in the end station 16. The end station 16 may be any type of end station, such as a serial end station operative to support a single wafer workpiece 30 or a batch end station adapted to support multiple wafers 30 for concurrent implantation using the conditioned beam 24 from the beamline assembly 14. To facilitate space charge neutralization and hence to inhibit beam blowup, the implantation system 10 further comprises an ion beam confinement apparatus including a photon source 34 that provides photons to a photoelectron source for emission of photoelectrons 36. In the illustrated system 10, the source of photoelectrons is an inner wall of the beamguide 32, where the photon source may be a UV or other lamp or laser providing photons of sufficient energy to the beamguide wall to eject electrons for space charge neutralization along the beam path. Lasers may be employed, for example, to provide mono-chromatic photons of a relatively narrow range of wavelengths, although any photon source may be employed within the scope of the invention.

Figure 2:
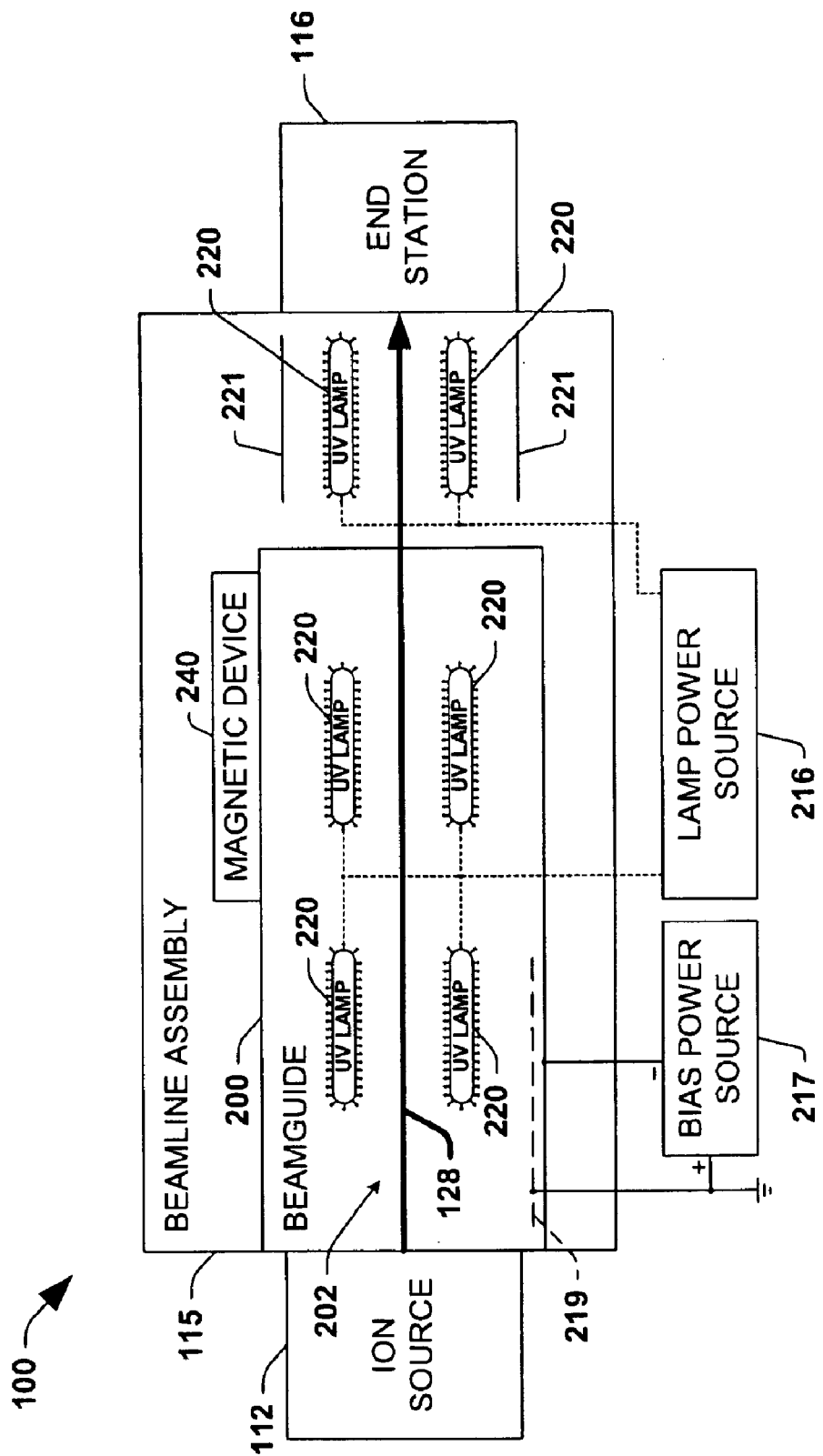
FIG. 2 is a simplified schematic diagram illustrating another exemplary ion implantation system in accordance with the invention.

FIG. 2 schematically illustrates another exemplary ion implantations system 100 having beam confinement apparatus in accordance with the invention. The implanter 100 comprises an ion source 112, a beamline assembly 115, and an end station 116, wherein a beamguide 200 provides a transport passageway 202 for an ion beam 128 extending through at least a portion of the beamline assembly 115. The exemplary beamline assembly 115 comprises a plurality of UV lamps 220 coupled with a lamp power source 216 to operate as a photon source along at least a portion of the passageway 202. UV lamps having a relatively narrow range of photon wavelengths may be selected so as to optimize the energy efficiency of the photon source, wherein lasers may alternatively be employed to provide a narrow wavelength range (e.g., mono-chromatic). A photoelectron source is also provided along the passageway 202, comprised of one or more walls of the beamguide 200 or portions thereof, and/or photoelectron source structures 221 positioned along the beam path between the end of the beam guide 200 and the end station 116. Alternatively or in combination, separate photoelectron source structures 221 may be provided within the beamguide 200. Any suitable photoemissive structure may be employed as the photoelectron source within the scope of the invention, which may be all or a portion of the beamguide 200 and/or a separate structure from the beamguide 200, as illustrated and described in greater detail with respect to FIGS. 8, 9, and 11 below.

The lamps 220 operate as a photon source to provide photons to at least a portion of the photoelectron sources 200 and 221, causing emission of photoelectrons to neutralize the space charge of the beam 128. The lamps 220 may be of any shape, configuration, and orientation within the scope of the invention, wherein several examples are illustrated and described below with respect to FIGS. 3–7. The energy of the photons emitted by the photon sources 220, the energy spread of emitted photons from the lamps 220, and the wavelength range of emitted photons, as well as the materials of the photoelectron sources 200 and 221 are selected such that the photon energy of at least some of the photons exceeds the work function of the photoelectron source material, thereby providing for photoemission of electrons from the beamguide walls 200 and/or from the surfaces of the source structures 221, as described further below with respect to FIG. 4D. A magnetic device 240 may be located in the beamline assembly 115 to provide multi-cusped magnetic fields in at least a portion of the passageway 202 for enhancing photoemission and for further confining the electrons emitted from the source 220, as illustrated and described in greater detail with respect to FIGS. 10 and 11 below. In addition, the photoelectron sources 220 and/or 221 may be biased using a bias power source 217 to enhance photoemission and/or to facilitate attraction of the generated photoelectrons toward the ion beam 128, where a grounded shield 219 may be employed to limit the effect of such source biasing on the beam 128, as illustrated and described further with respect to FIGS. 9 and 11 below.

Figure 3:
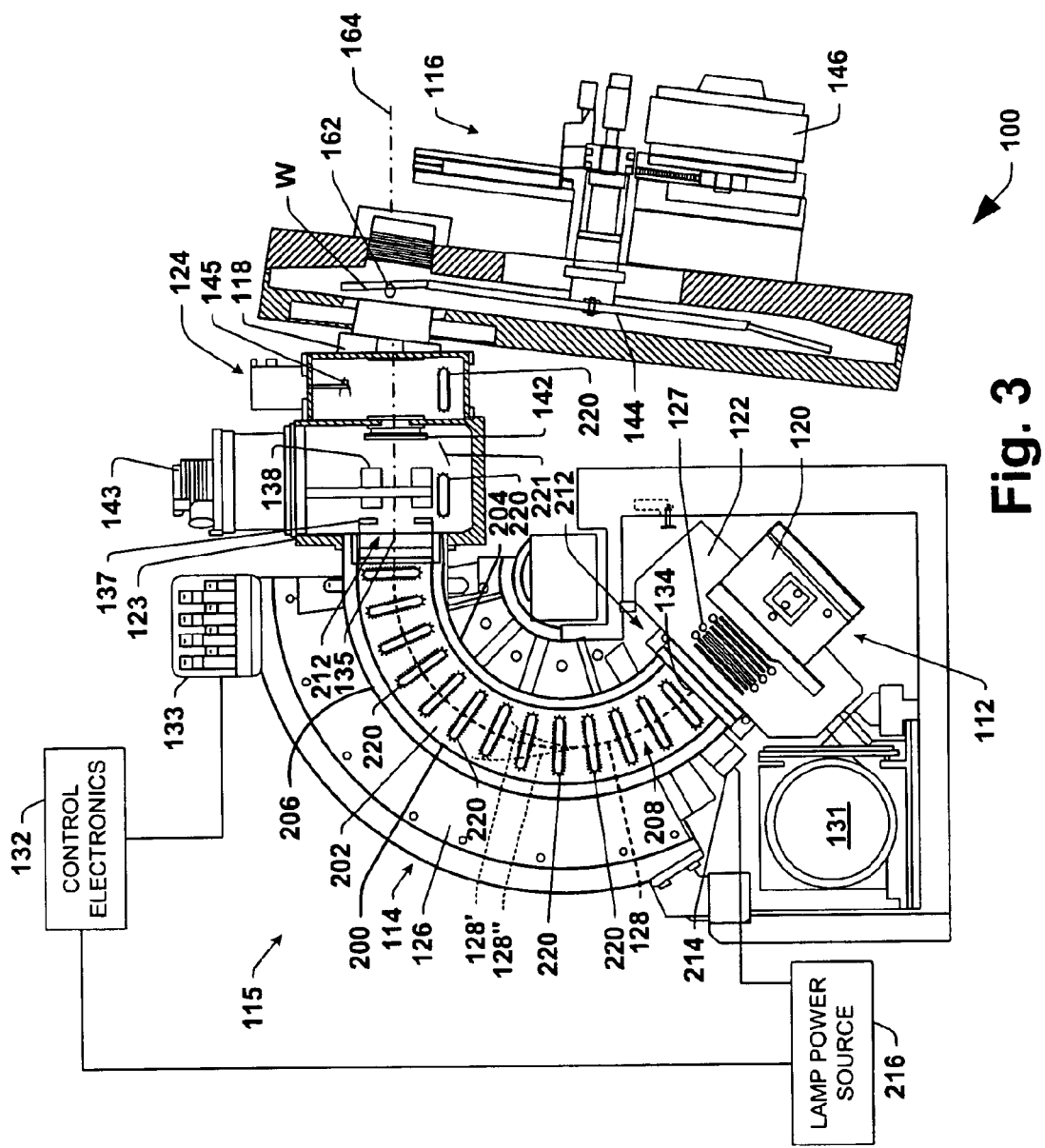
FIG. 3 is a detailed sectional top plan view further illustrating the ion implantation system of FIG. 2.

Referring now to FIGS. 3 and 4A–4D, a more detailed illustration is provided of the exemplary ion implantation system 100 and the beam confinement apparatus thereof. As shown in FIG. 3, the beamline assembly 115 comprises a mass analysis magnet 114 for selectively providing only ions of a desired charge to mass ratio to the end station 116, where the beamline assembly 115 and the end station 116 are connected by an expansible stainless steel bellows assembly 118 to permit movement of the end station 116 with respect to the beamline assembly 115. The ion source 112 comprises a plasma chamber 120 and an ion extractor assembly 122 having a plurality of electrodes 127. Energy is imparted to an ionizable dopant gas to generate ions within the plasma chamber 120. The ions are extracted from the chamber 120 through a slit therein by the ion extractor assembly 122 to create an ion beam 128 comprised of positive ions from the plasma chamber 120 and to accelerate the extracted ions into the mass analysis magnet 114.

The mass analysis magnet 114 provides only ions of an appropriate charge-to-mass ratio to end station 116 through a resolver housing 123 and a beam neutralizer 124 in the beamline assembly 115. The beam 128 is transported in the mass analysis magnet 114 along a curved beam path 208 within a passageway 202 defined by the beamguide 200 having inner and outer side walls 204 and 206, where the passageway 202 is evacuated by a vacuum pump 131. The ion beam 128 that propagates along the path 208 is affected by the dipole magnetic field generated by the mass analysis magnet 114, so as to reject ions of an inappropriate charge-to-mass ratio. The strength and orientation of this dipole magnetic field is controlled by control electronics 132 which adjust the electrical current through the field windings of the magnet 114 through a magnet connector 133. The dipole magnetic field causes the ion beam 128 to move along the curved beam path 208 from a first or entrance trajectory 134 at a beamguide entrance end 210 near the ion source 112 to a second or exit trajectory 135 at an exit end 212 near the resolver housing 123. Portions 128' and 128" of the beam 128 comprised of ions having an inappropriate charge-to-mass ratio are deflected away from the curved trajectory of the path 208 and into the sidewalls 204 and 206 or collide with the resolving slit 123, respectively, of the beamguide 206. In this manner, the mass analyzer 114 passes through the resolver housing 123 only those ions in the beam 128 which have the desired charge-to-mass ratio.

The beam 128 is thus mass analyzed and transported from the ion source 112 through the beamguide 200 to the resolver housing 123, which includes a terminal electrode 137, an electrostatic lens 138 for focusing the ion beam 128, and a dosimetry indicator such as a Faraday flag 142. The beam neutralizer 124 includes a plasma shower 145 for neutralizing the positive charge that would otherwise accumulate on the target wafer as a result of being implanted by the positively charged ion beam 128. The beam neutralizer 124 and the resolver housing 123 are evacuated by a vacuum pump 143. The beam 128 is thus provided to the end station 116, which includes a disk-shaped wafer support 144 upon which wafers W are mounted for implantation by the beam 128. The wafer support 144 resides in a target plane which is generally perpendicularly oriented to the direction of the implant beam 128, where the disc shaped wafer support 144 is rotated by a motor 146 in the end station 116. The ion beam 128 thus strikes wafers mounted to the support as they move in a circular path. The end station 116 pivots about point 162, which is the intersection of the path 164 of the ion beam and the wafer W, so that the target plane is adjustable about this point.

Figure 4A:
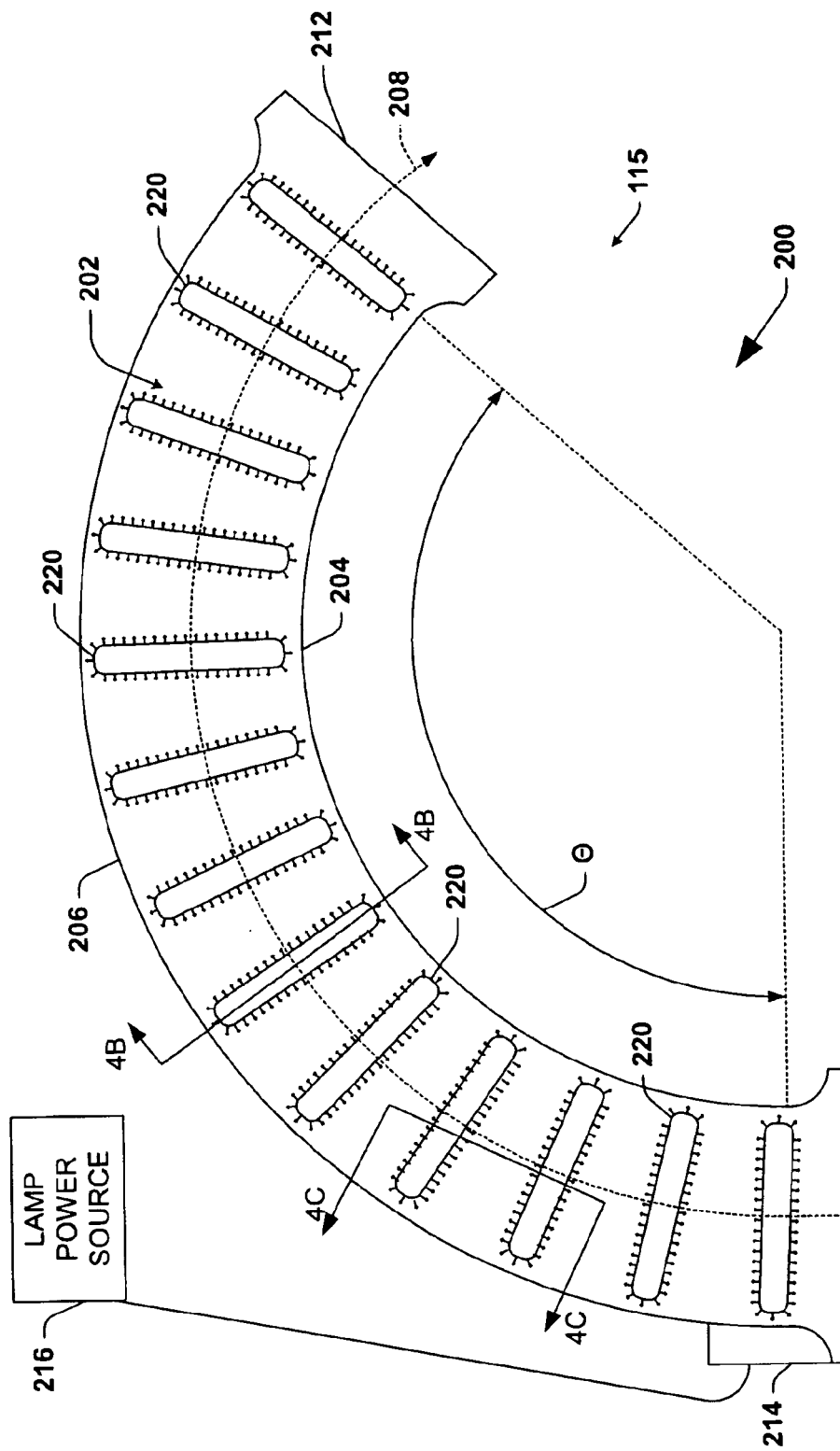
FIG. 4A is a top plan view further illustrating the beamguide of the implantation system of FIG. 3.
Figure 4B:
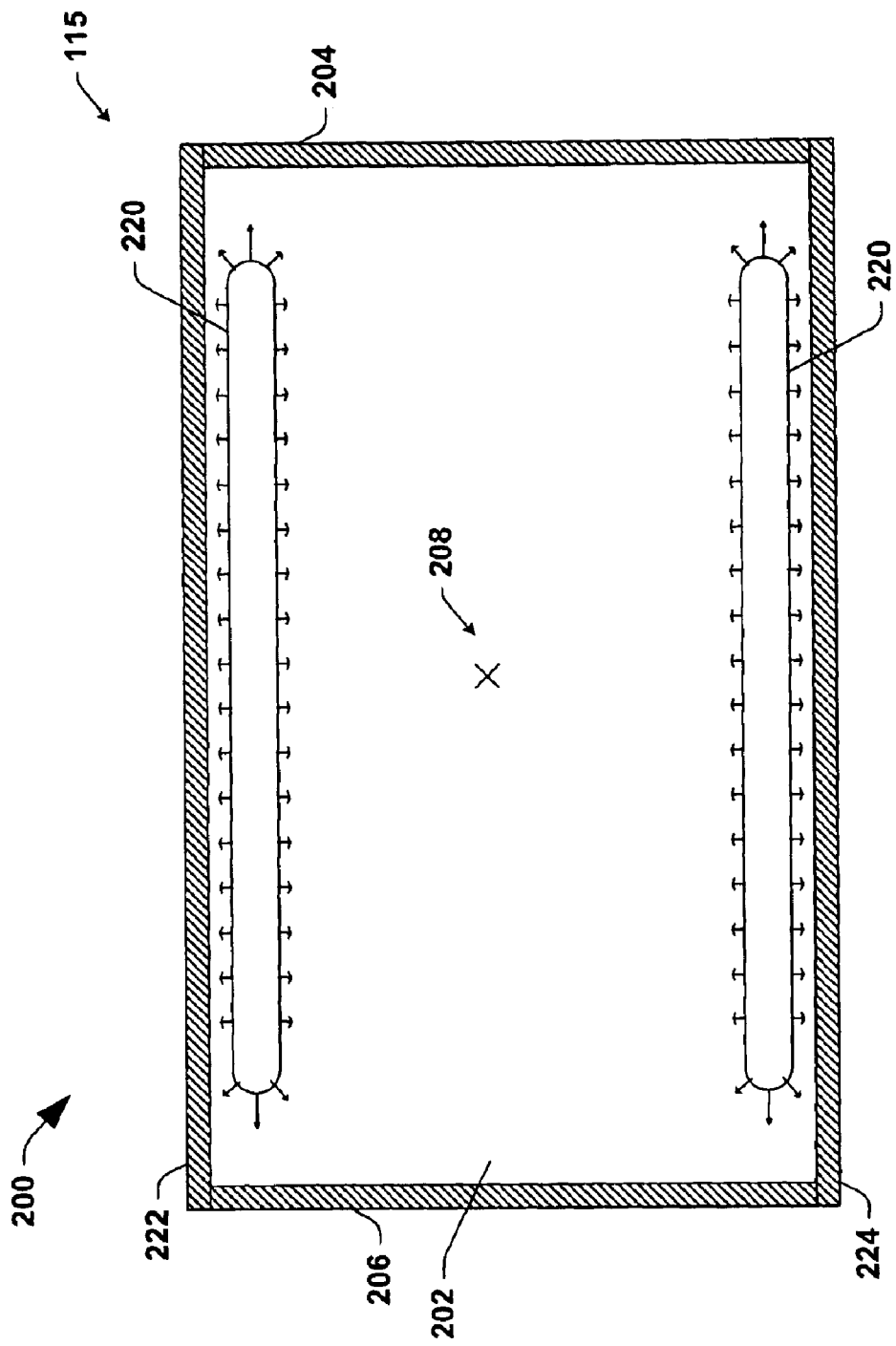
FIG. 4B is a sectional elevation view illustrating the beamguide of FIGS. 3 and 4A taken along line 4B—4B of FIG. 4A.
Figure 4C:
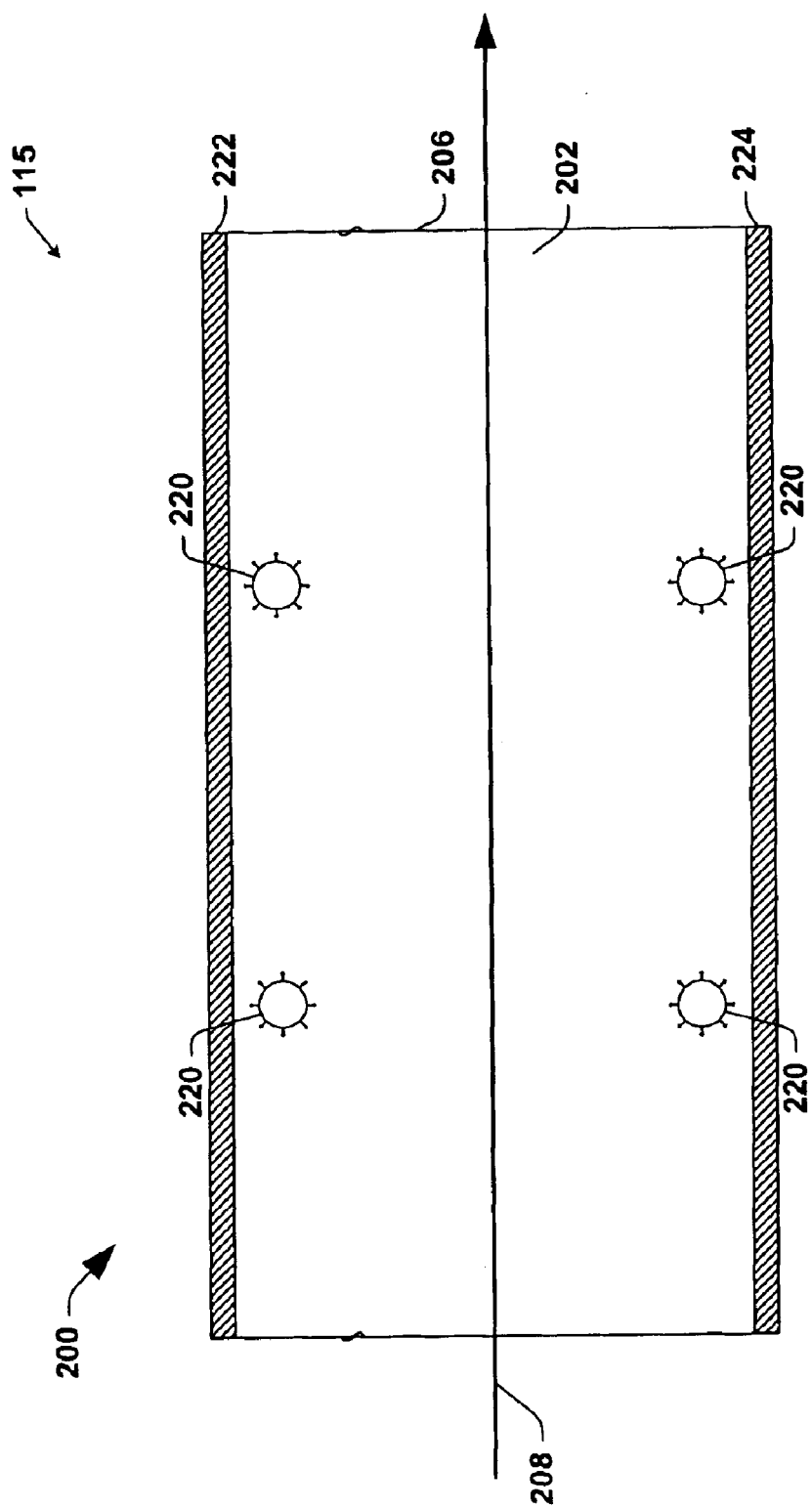
FIG. 4C is a sectional side elevation view illustrating the beamguide of FIGS. 3 and 4A taken along line 4C—4C of FIG. 4A.

As further illustrated in FIGS. 4A and 4B, the beamguide 200 provides an arcuate longitudinal passageway 202 defined by inner and outer arcuate side walls 204 and 206, and top and bosom walls 222 and 224, respectively, along an ion beam path 208. The beamguide 200 extends longitudinally along the path 208 from the entrance end 210 to the exit end 212 through an arc angle θ of approximately 135 degrees in this particular implementation. The invention may be employed in conjunction with mass analyzers of any angle, wherein the angle may be chosen to satisfy mass resolution and beam focusing properties. The walls 204, 206, 222, and 224 are fabricated from aluminum, although other photoemissive materials may alternatively be used in accordance with the invention.

In implementations where the beamguide 200 or portions thereof are used as a source of photoelectrons, the beamguide 200 may be coated or treated with a work function lowering material, for example, such as lanthanum hexaboride ($LaB_6$). In this regard, aluminum has a work function of approximately 4.08 eV and lanthanum hexaboride has a lower work function of about 2.66 eV. Other photoelectron source structures 221 elsewhere in the beamline assembly 115 and/or dedicated support structures 221 located within the beamguide 200 (e.g., structures 221 in FIGS. 8, 9, and 11 below) may likewise be fabricated from or coated with such materials to provide a photoelectron source with a low work function. The following table provides examples of materials which may be used alone or in combination in fabricating or coating a photoelectron source structure in accordance with the invention.

TABLE 1

| ELEMENT | WORK FUNCTION (eV) |
| --- | --- |
| Aluminum | 4.08 |
| Berylium | 5.0 |
| Cadmium | 4.07 |
| Calcium | 2.9 |
| Carbon | 4.81 |
| Cesium | 2.1 |
| Cobalt | 5.0 |
| Copper | 4.7 |
| Gold | 5.1 |
| Iron | 4.5 |
| Lead | 4.14 |
| Magnesium | 3.68 |
| Mercury | 4.5 |
| Nickel | 5.01 |
| Niobium | 4.3 |
| Potassium | 2.3 |
| Platinum | 6.35 |
| Selenium | 5.11 |
| Silicon | 4.8 |
| Silver | 4.73 |
| Sodium | 2.28 |
| Tungsten | 4.5 |
| Uranium | 3.6 |
| Zinc | 4.3 |

The materials for fabricating and/or coating the beamguide 200 or other photoelectron source 221 may be selected so as to provide a low work function, thereby allowing flexibility in selecting the photon sources 220 and the wavelength and power specifications thereof. The material selection may also take into account various considerations related to implantation systems generally, including but not limited to cost, ease of manufacture, durability, and potential contamination of implanted wafers W in the end station 116.

FIGS. 3 and 4A–4D illustrate one possible implementation of the invention, wherein a plurality of lamps 220 are disposed proximate the upper and lower beamguide walls 222 and 224, respectively, along the arcuate length of the beamguide 200. A lamp power source 216 provides power to the lamps 220 via a coupling port 214, wherein wiring (not shown) from the port 214 to the lamps 220 may be provided along the beamline assembly 215 in any suitable manner to power the lamps 220. In this example, the lamps 220 extend laterally on either side of the beam path 208 and generate ultraviolet (UV) light that provides photons to the beamguide inner wall surfaces (e.g., beamguide walls 204, 206, 222, and/or 224) for generation of photoelectrons. The wavelength, power rating, size, orientation, and/or configuration of the lamps may be selected so as to provide at least some photons of sufficient energy to cause emission of photoelectrons from the photoelectron sources 200, 221 for space charge neutralization. Moreover, the photon sources 220 may be configured to provide photons of a controlled wavelength range, such as mono-chromatic light from a laser 220 or UV light of relatively small wavelength range from a UV lamp 220. The generation rate of photoelectrons required to neutralize the ion beam depends on the beam current, the system geometry, and the method chosen to confine the electrons within the beamguide.

Figure 4D:
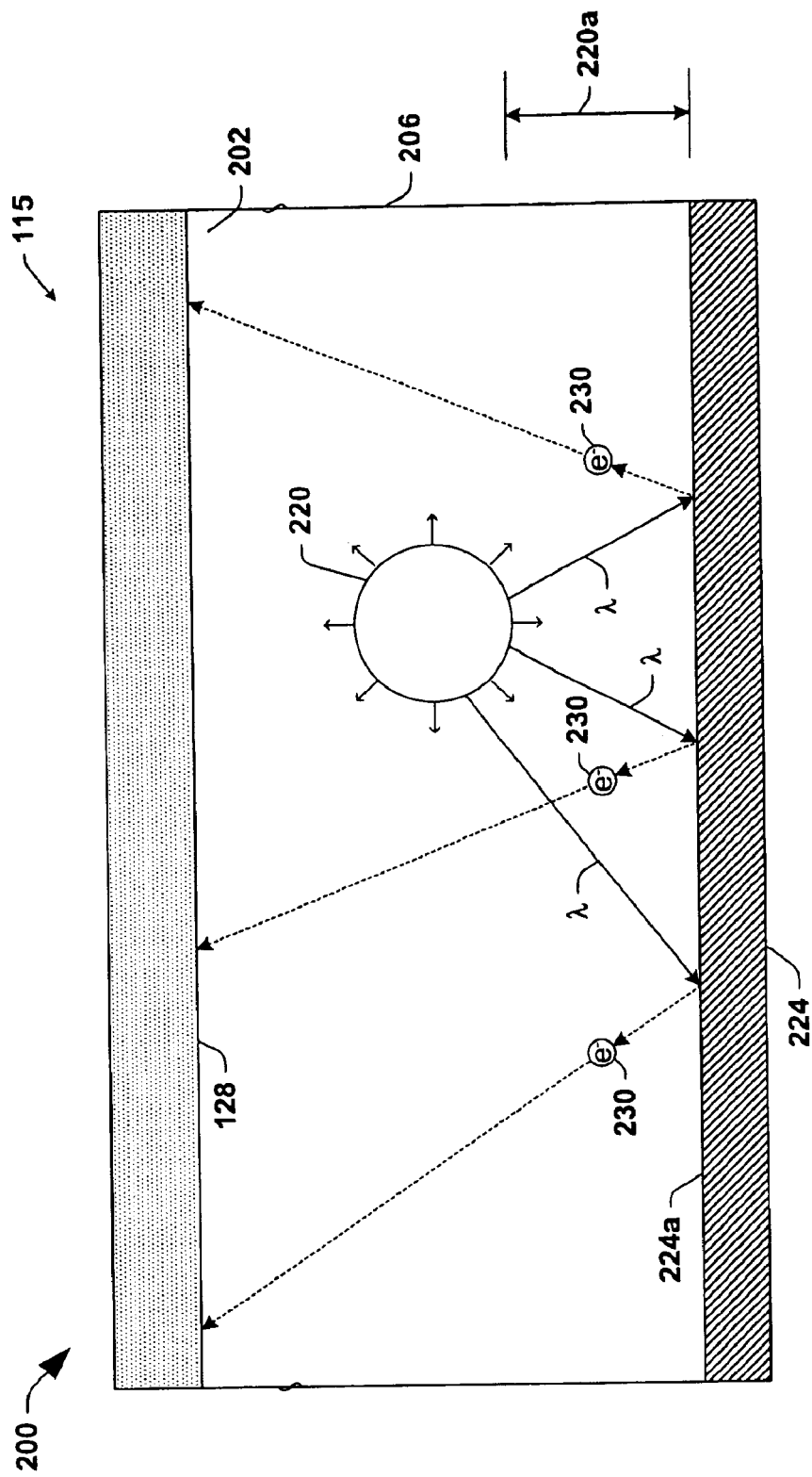
FIG. 4D is another sectional side elevation view of the beamguide of FIGS. 3 and 4A illustrating photoemission in accordance with the invention.

As illustrated in FIG. 4D, the exemplary UV lamps 220 are adapted to generate at least some photons λ of sufficient energy to cause photoemission of photoelectrons 230 from the walls of the beamguide 200. In one implementation, the lamps 220 are spaced from the beamguide walls 222 and 224 by a distance 220a and provide UV light at a wavelength in the range of about 1 E–8 m to about 4E–7 m corresponding to photons having energies in the range of about 3.125 eV to about 125 eV. Where the beamguide 200 and/or the photoelectron source structures 221 are fabricated from aluminum (e.g., work function of about 4.08 eV) or aluminum coated with lanthanum hexaboride (e.g., work function of about 2.66 eV), some or all of the photons λ impinging on the photoelectron sources 200, 221 (e.g., surface 224a of the lower beamguide wall 224) thus generate photoelectrons 230 to neutralize the space charge of the beam 128.

Referring now to FIGS. 5A, 5B, 6, and 7, any number of such lamps 220 may be provided in accordance with the invention (e.g., one or more), wherein the lamps 220 may be of any suitable size and/or shape. Another possible implementation is illustrated in FIGS. 5A and 5B, wherein arcuate lamps 220 extend generally parallel with the beam path 208 within the beamguide 200. As illustrated in FIG. 6, one or more generally straight UV lamps 220 may be configured to extend generally longitudinally along the beam path 208. Another possible example is illustrated in FIG. 7, wherein circular lamps 220 are located at various points along the interior of the beamguide 200 for photon generation in accordance with the invention.

Figure 12:
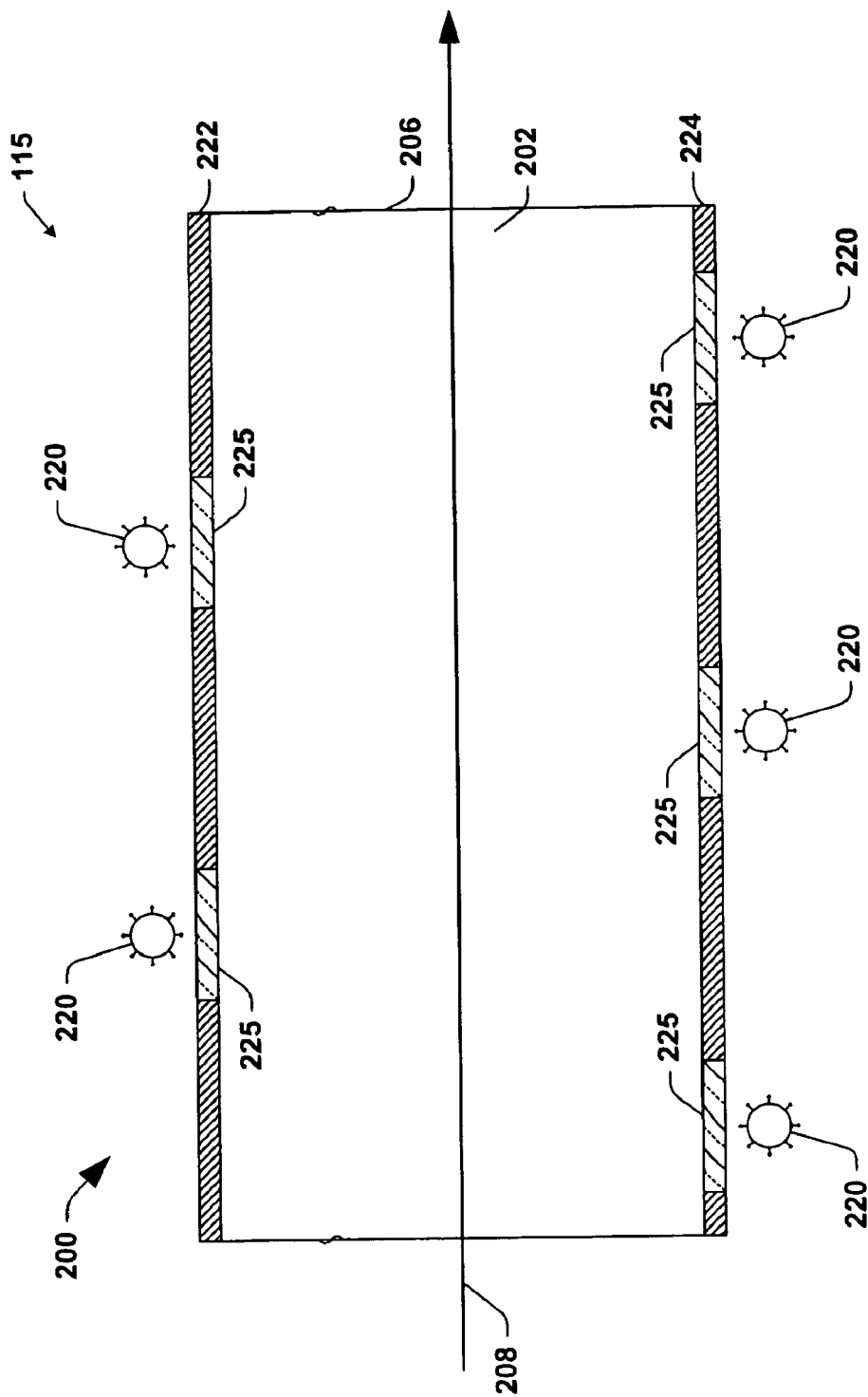
FIG. 12 is a sectional side elevation view illustrating another exemplary beam confinement apparatus with a photon source located outside a beamguide providing photons to a photoelectron source within the beamguide in accordance with another aspect of the invention.

Alternatively, the lamps or lasers 220 can be located outside of the beamguide 200 to illuminate the photoelectron source(s) 200, 221 along the interior of the beamguide 200 through transparent windows 225, as illustrated in FIG. 12. In one example using UV lamps 220, the windows 225 are made from materials transparent to UV light, including but not limited to quartz, calcium fluorite ($CaF_2$), or magnesium fluorite ($MgF_2$). The illustrated examples are not exhaustive of the possible implementations within the scope of the present invention, wherein the wavelength, wavelength range, power rating, size, orientation, and/or configuration of the lamps 220 may be selected so as to provide photons of sufficient energy to cause emission of photoelectrons from the photoelectron sources 200, 221. In this regard, the invention is not limited to UV lamps, but may be practiced using any photon source 220, including but not limited to UV lamps and lasers.

Figure 8:
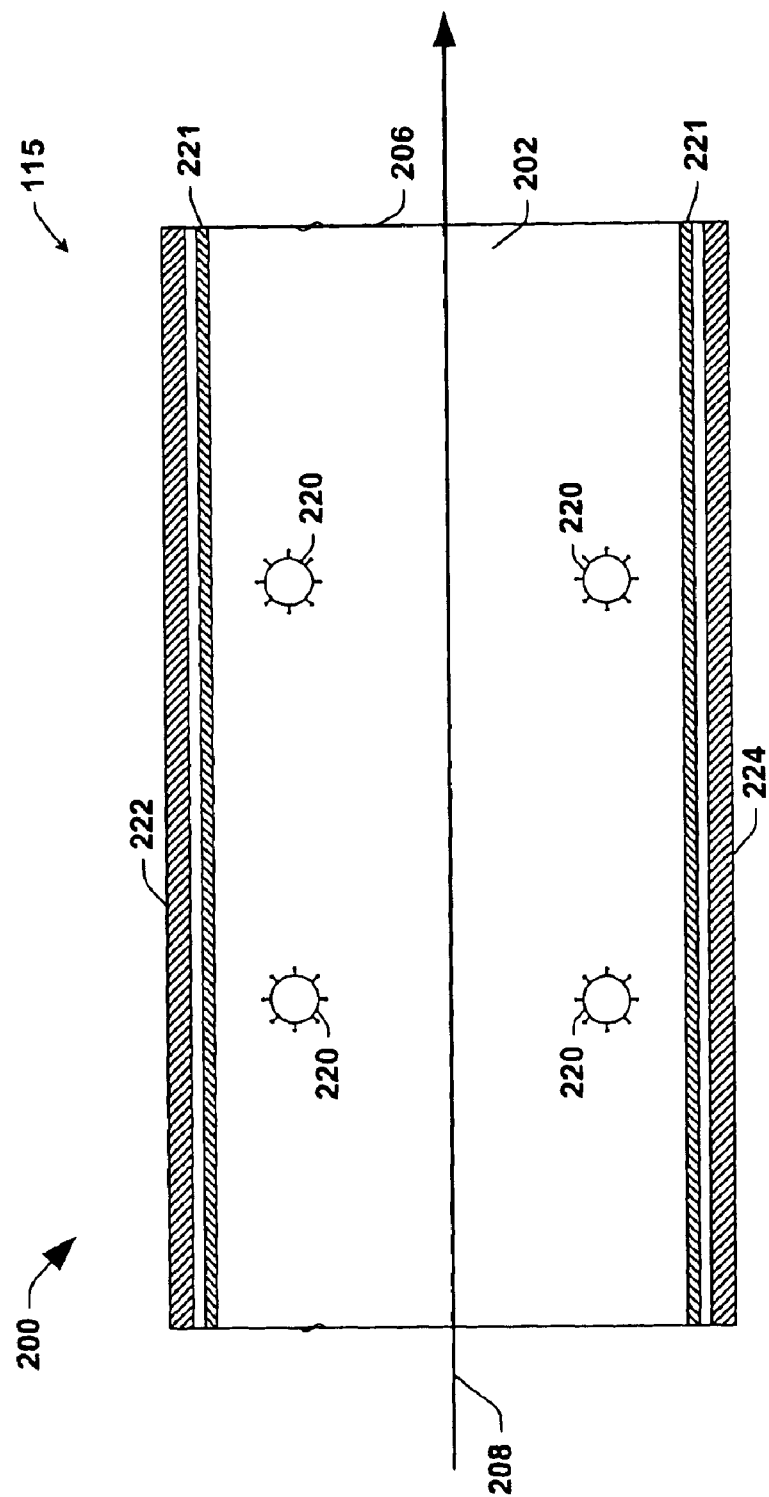
FIG. 8 is a sectional side elevation view illustrating another exemplary beam confinement apparatus with a photoelectron source spaced from a beamguide sidewall in accordance with another aspect of the invention.

Referring now to FIG. 8, photoelectron source structures 221 may be provided in the beamline assembly 115, which may be fabricated from or coated with any suitable photoemissive materials. The photoelectron source structures 221 may be located anywhere between the implanter ion source 112 and the end station 116 (FIG. 3), such as within the beamguide 200, wherein the photoelectron source structures may be spaced from a wall of the beamguide. In the example of FIG. 8, photoelectron source structures 221 are spaced inwardly from the upper and lower beamguide walls 222 and 224, respectively. Other configurations are possible, where the photoelectron source structures 221 are situated along any wall or walls of the beamguide 200 (e.g., side walls 204 and/or 206), or any location within the beamline assembly 115 (e.g., in the resolver housing 123 of FIG. 3), wherein all such configurations are contemplated as falling within the scope of the present invention and the appended claims.

Figure 9:
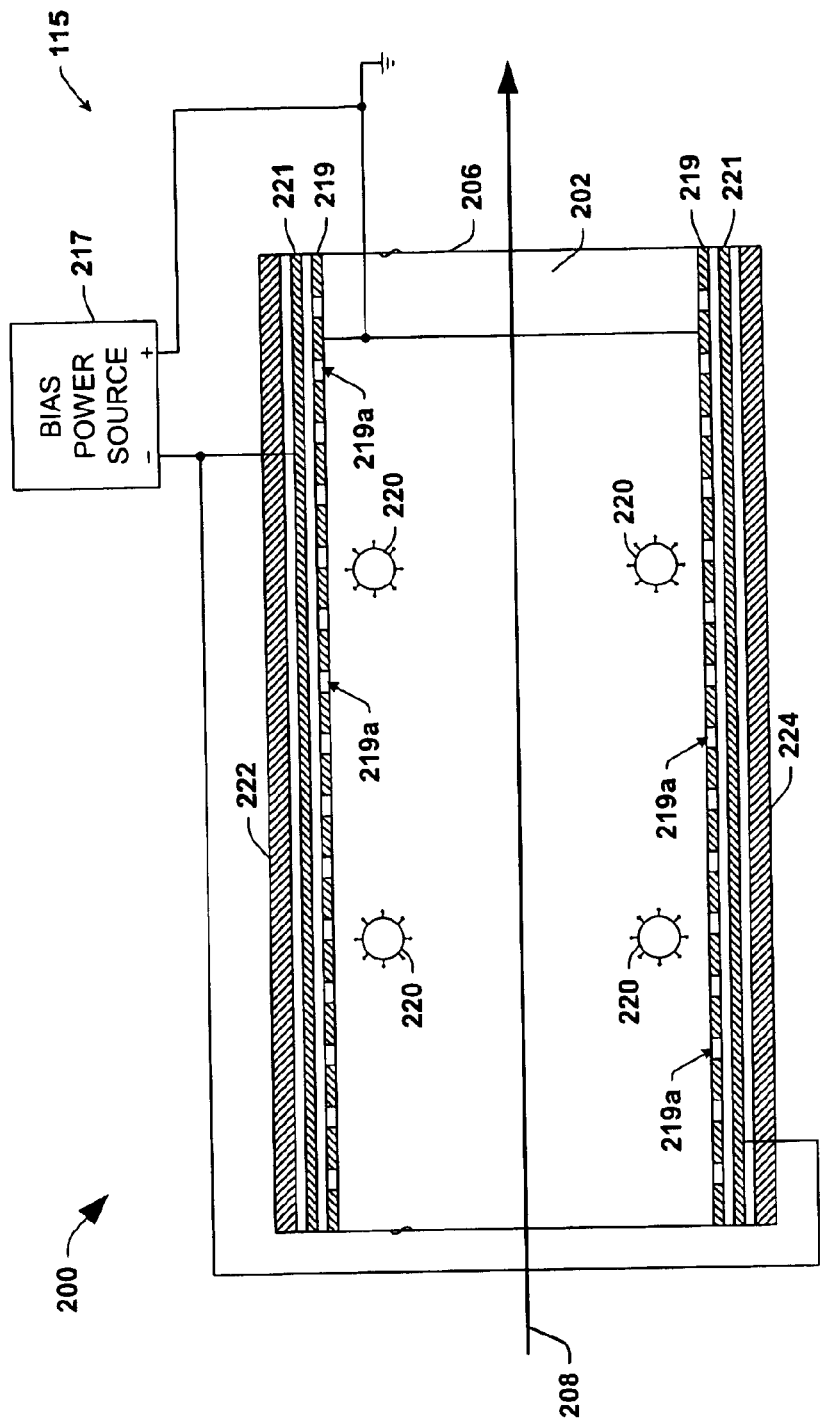
FIG. 9 is a sectional side elevation view illustrating another exemplary beam confinement apparatus with a biased photoelectron source and a grounded sheath in accordance with yet another aspect of the invention.
Figure 10:
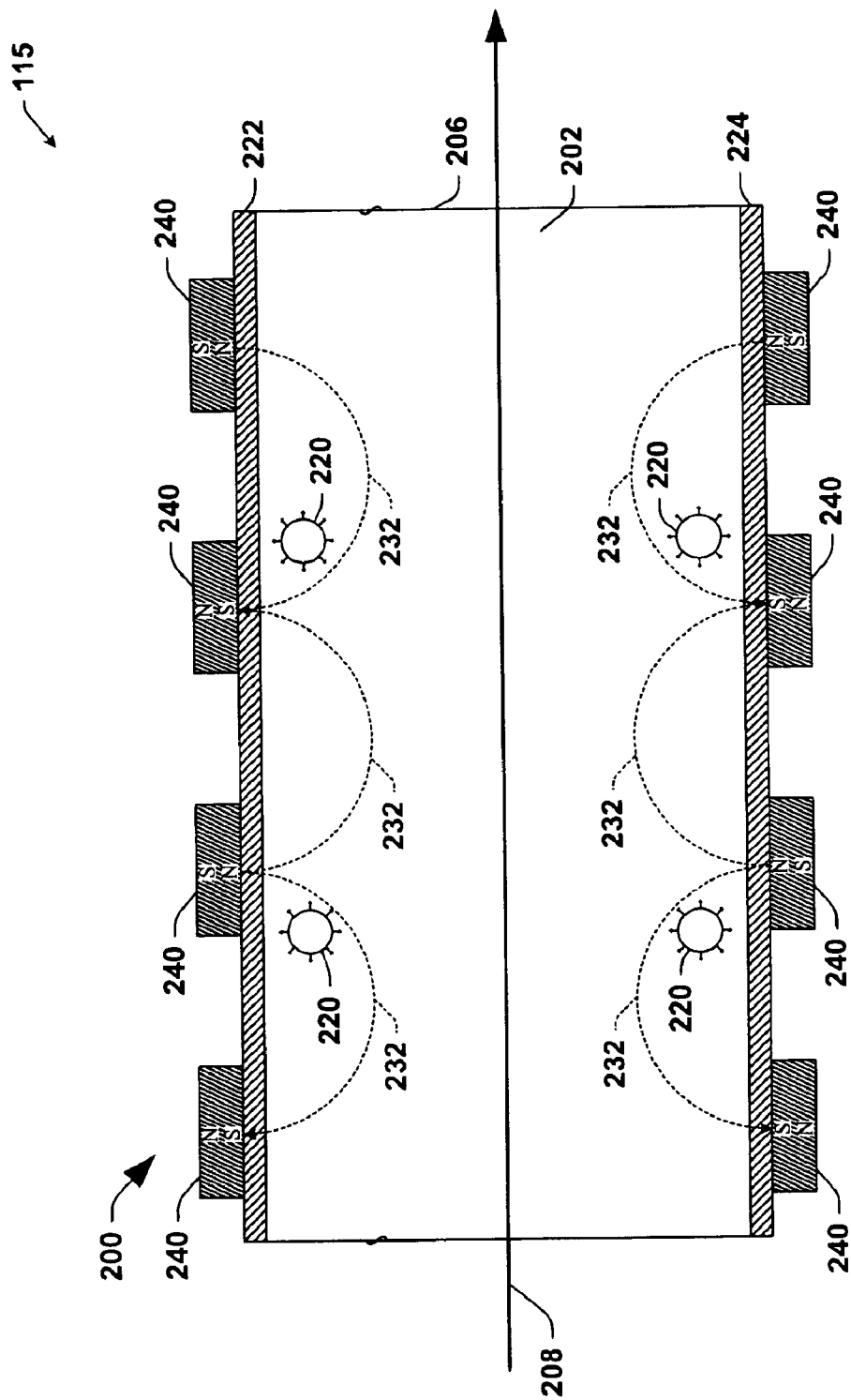
FIG. 10 is a sectional side elevation view illustrating another exemplary beam confinement apparatus with multi-cusped magnetic fields in accordance with the invention.
Figure 11:
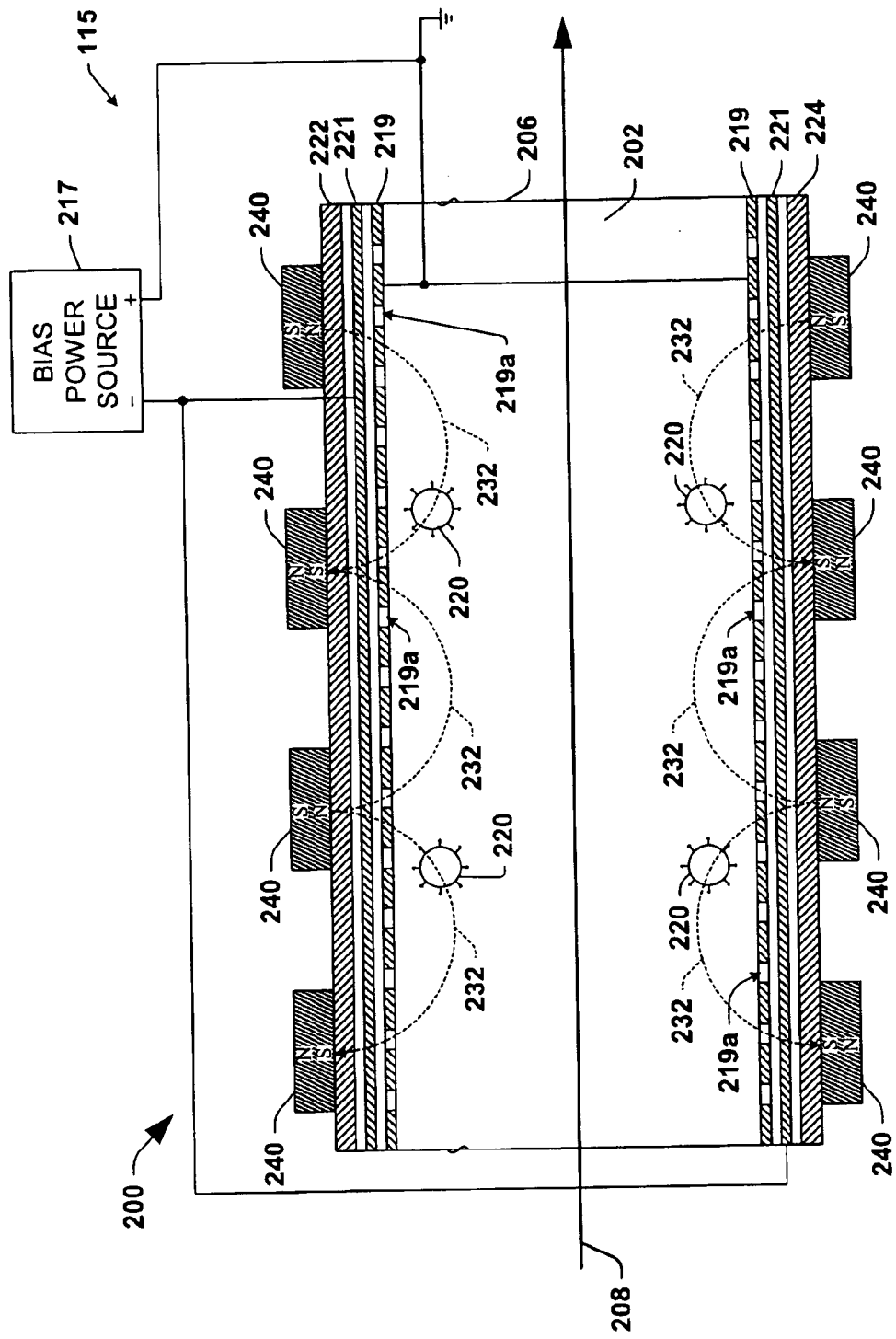
FIG. 11 is a sectional side elevation view illustrating still another exemplary beam confinement apparatus with multi-cusped magnetic fields and a biased photoelectron source in accordance with the invention.

Referring now to FIGS. 9 and 11, another aspect of the invention provides a conductive sheath 219 spaced from the photoelectron source 221 in the beamline assembly 115, wherein the photoelectron source 221 is biased negatively with respect to the conductive sheath 219 using a bias power source 217. This aspect of the invention can be employed separately or in combination with the provision of magnetic fields for enhanced photoemission and/or to improve the amount of neutralizing photoelectrons provided to a beam along the path 208, as illustrated and described further below with respect to FIGS. 10 and 11. Where a positive ion beam 128 is being used to implant the wafers W (e.g., FIGS. 2 and 3), the ion beam potential is generally positive with respect to grounded beamguide sidewalls. The potential between the sidewalls and the ion beam itself may be insufficient to draw the generated photoelectrons away from the beamguide surface. The biasing of FIGS. 9 and 11 allows adjustment of the potential between the photoelectron source 221 and the beam 128 along the path 208, wherein the bias power source 217 may be controlled by the control electronics 132 (FIG. 3) to provide a negative DC bias in the range of zero to about 200 volts in one example.

In addition to directing photoelectrons toward the beam 128, the biasing may also enhance photoemission from the source 221. In the examples of FIGS. 9 and 11, the photoelectron source structures 221 are spaced inwardly from the walls of the beamguide 200, and a slotted grounded shield or sheath 219 is spaced inwardly from the source 221 so that the electric field from the biased source structure 221 does not interfere with the beam 128 itself. While the electric field may not lower the work function of the photoemissive material significantly, the electric field resulting from biasing the source structure 221 relative to ground operates to more readily direct the photoelectrons into the ion beam 128. As the beam becomes more and more neutral, the positive beam potential becomes lower and lower, wherein the source biasing may advantageously provide additional potential at the photoemission surface to push the emitted electrons into the beam. In this regard, as little as a few volts of bias may provide improved performance, although any bias voltage is possible within the scope of the invention. In addition, the bias potential created in this configuration may also serve to confine electrons within the volume of the beamguide 200 (e.g., when the electrons move close to the beamguide walls, they will encounter the negative potential and be repelled back toward the beam 128).

The biasing and the selection of source materials and/or coatings may thus be employed to provide sufficient photoemission for space charge neutralization, while allowing the use of lower power photon sources 220, where the biasing and source materials may be selected to facilitate the use of commercially available photon sources 220, such as UV lamps 220 or others. As shown in FIGS. 9 and 11, the grounded sheath 219 directs the electric field toward the beam 128, so that the generated photoelectrons tend to move more easily toward the positive ion beam 128. The sheath 219 also operates to shield the beam 128 from the electric field of the photoelectron source 221. In addition, the sheath 219 acts as a partial shield to protect the photoemissive surfaces from direct impact from the beam 128. The sheath 219 may comprise one or more openings such as slots 219a to provide a path for the emitted photoelectrons to travel to the beam 128.

Referring also to FIGS. 10 and 11, another aspect of the invention provides a magnetic device 240 in the beamline assembly 115, which generates multi-cusped magnetic fields 232 in at least a portion of the passageway 202. The magnetic devices 240 are preferably located such that the resulting magnetic fields 232 do not inhibit the provision of photoelectrons from the beamguide walls to the ion beam. The magnetic fields 232 may be provided using any suitable magnetic device 240, wherein the fields 232 operate to enhance the confinement of the electrons in the beamline assembly 115. In the examples of FIGS. 10 and 11, a plurality of permanent magnets 240 are located along at least a portion of the passageway 202, where the magnets 240 are situated on the outer surfaces of the upper and lower beamguide walls 222 and 224, respectively, although other implementations are possible where the magnets 240 may be located anywhere along the beamline assembly 115 to provide multi-cusped magnetic fields 232 in at least a portion of the passageway 202. In one possible implementation, the magnetic devices 240 may alternatively be provided along the sidewalls 204 and 206 of the beamguide 200, with photons being directed to the upper and lower beamguide walls 222 and 224 for emission of photoelectrons for space charge neutralization of the beam. As can be seen in FIGS. 10 and 11, the magnetic devices 240 may be employed for photoemission enhancement alone or in combination with the biasing techniques described above, wherein all such implementations are contemplated as falling within the scope of the invention and the appended claims.

Although the invention has been illustrated and described with respect to one or more implementations, alterations and/or modifications may be made to the illustrated examples without departing from the spirit and scope of the appended claims. In particular regard to the various functions performed by the above described components or structures (blocks, units, engines, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An ion implantation system, comprising:
   an ion source adapted to produce an ion beam along a path;
   a beamline assembly located downstream from the ion source along the path, the beamline assembly comprising:
   a beamguide comprising an entrance end downstream of the ion source and an exit end downstream of the entrance end, the beamguide defining a passageway between the entrance and exit ends through which the ion beam is transported along the path;
   a photoelectron source extending substantially along an entire length of the passageway between the entrance and exit ends; and
   a photon source providing photons to at least a portion of the photoelectron source to cause emission of photoelectrons from the photoelectron source; and
   an end station located downstream from the beamline assembly along the path, the end station being adapted to support at least one wafer along the path for implantation using the ion beam.

2. The ion implantation system of claim 1, wherein the photon source comprises at least one laser.

3. The ion implantation system of claim 1, wherein the beamguide comprises at least one window and wherein the photon source is located outside the beamguide to provide photons to at least a portion of the photoelectron source through the at least one window.

4. The ion implantation system of claim 1, wherein the photoelectron source comprises aluminum.

5. The ion implantation system of claim 4, wherein the photoelectron source comprises lanthanum hexaboride.

6. The ion implantation system of claim 1, wherein the beamline assembly further comprises a magnetic device adapted to provide multi-cusped magnetic fields in at least a portion of the passageway.

7. The ion implantation system of claim 6, wherein the magnetic device comprises a plurality of permanent magnets located along at least a portion of the passageway.

8. The ion implantation system of claim 1, wherein the beamline assembly further comprises a mass analyzer through which a portion of the beamguide passes, the mass analyzer being adapted to receive the ion beam from the ion source and to direct ions of a desired charge-to-mass ratio along the path toward the end station.

9. The ion implantation system of claim 8, wherein the photoelectron source and the photon source cooperatively provide photoelectrons in the portion of the beamguide which passes through the mass analyzer.

10. The ion implantation system of claim 1, wherein the photon source comprises at least one lamp providing light to the photoelectron source.

11. The ion implantation system of claim 10, wherein the at least one lamp provides photons having an energy exceeding a work function of the photoelectron source.

12. The ion implantation system of claim 10, wherein the at least one lamp provides ultraviolet or visible light to the photoelectron source.

13. The ion implantation system of claim 1, wherein the photoelectron source is spaced from a wall of the beamguide.

14. The ion implantation system of claim 13, wherein the beamline assembly further comprises a conductive sheath spaced from the photoelectron source and wherein the photoelectron source is biased with respect to the conductive sheath.

15. The ion implantation system of claim 14, wherein the conductive sheath comprises at least one opening.

16. The ion implantation system of claim 14, wherein the beamline assembly further comprises a magnetic device adapted to provide multi-cusped magnetic fields in at least a portion of the passageway.

17. The ion implantation system of claim 16, wherein the magnetic device comprises a plurality of permanent magnets located along at least a portion of the passageway.

18. The ion implantation system of claim 16, wherein the magnetic device provides multi-cusped magnetic fields at the photoelectron source to enhance emission of photoelectrons.

19. The ion implantation system of claim 1, wherein the photoelectron source comprises an inner wall of the beamguide.

20. The ion implantation system of claim 19, wherein the inner wall of the beamguide comprises aluminum.

21. The ion implantation system of claim 19, wherein the inner wall of the beamguide comprises lanthanum hexaboride.

22. The ion implantation system of claim 19, wherein the beamline assembly further comprises a magnetic device adapted to provide multi-cusped magnetic fields in at least a portion of the passageway.

23. The ion implantation system of claim 22, wherein the magnetic device comprises a plurality of permanent magnets located along at least a portion of the passageway.

24. The ion implantation system of claim 23, wherein the plurality of magnets are mounted along an outer surface of at least one beamguide wall.

25. The ion implantation system of claim 19, wherein the beamline assembly further comprises a mass analyzer through which a portion of the beamguide passes, the mass analyzer being adapted to receive the ion beam from the ion source and to direct ions of a desired charge-to-mass ratio along the path toward the end station.

26. The ion implantation system of claim 25, wherein the photoelectron source and the photon source cooperatively provide photoelectrons in the portion of the beamguide which passes through the mass analyzer.

27. The ion implantation system of claim 19, wherein the photon source comprises at least one lamp providing light to the photoelectron source.

28. The ion implantation system of claim 27, wherein the at least one lamp provides photons to the photoelectron source having an energy exceeding a work function of the photoelectron source.

29. The ion implantation system of claim 27, wherein the at least one lamp provides ultraviolet or visible light to the photoelectron source.

30. The ion implantation system of claim 27, wherein the inner wall of the beamguide comprises aluminum.

31. The ion implantation system of claim 30, wherein the inner wall of the beamguide comprises lanthanum hexaboride.

32. The ion implantation system of claim 27, wherein the inner wall of the beamguide comprises lanthanum hexaboride.

33. Beam confinement apparatus for inhibiting ion beam blowup in an ion beam transport passageway, the confinement apparatus comprising:
   a photoelectron source located substantially along an entire length of a passageway defined by a beamguide; and
   a photon source providing photons to at least a portion of the photoelectron source to cause emission of photoelectrons from the photoelectron source.

34. The apparatus of claim 33, wherein the photoelectron source comprises an inner wall of the beamguide.

35. The apparatus of claim 33, wherein the photon source comprises at least one lamp providing light to the photoelectron source.

36. The apparatus of claim 33, further comprising a magnetic device adapted to provide multi-cusped magnetic fields in at least a portion of the passageway.

37. The apparatus of claim 33, wherein the photoelectron source and the photon source cooperatively provide photoelectrons in a portion of the passageway passing through a mass analyzer.

38. The apparatus of claim 33, further comprising a conductive sheath spaced from the photoelectron source, wherein the photoelectron source is biased with respect to the conductive sheath.

39. The apparatus of claim 38, further comprising a magnetic device adapted to provide multi-cusped magnetic fields in at least a portion of the passageway.

40. The apparatus of claim 39, wherein the magnetic device provides multi-cusped magnetic fields at the photoelectron source to enhance emission of photoelectrons.

41. The apparatus of claim 33, wherein the photon source comprises at least one laser.

42. The apparatus of claim 33, wherein the passageway comprises at least one window and wherein the photon source is located outside the passageway to provide photons to at least a portion of the photoelectron source through the at least one window.

43. A method of providing ion beam containment in an ion implantation system, the method comprising:

provising a photoelectron source along an ion beam path in substantially an entire length of a passageway defined by a beamguide; and providing photons to at least a portion of the photoelectron source to cause emission of photoelectrons from the photoelectron source.

44. The method of claim 43, wherein providing the photoelectron source comprises providing a beamguide downstream from an ion source, and wherein providing photons comprising providing photons to at least a portion of the beamguide to cause emission of photoelectrons from the beamguide.

45. The method of claim 43, wherein providing the photons comprises providing at least one lamp or laser along the path to provide light to the photoelectron source.

46. The method of claim 43, wherein providing the photons comprises providing photons to the photoelectron source having an energy exceeding a work function of the photoelectron source.

47. The method of claim 43, further comprising providing multi-cusped magnetic fields at the photoelectron source to enhance emission of photoelectrons.

48. The method of claim 43, further comprising:

providing a conductive sheath spaced from the photoelectron source; and biasing the photoelectron source negatively with respect to the conductive sheath to enhance emission of photoelectrons.

49. The method of claim 48, further comprising providing multi-cusped magnetic fields at the photoelectron source to enhance emission of photoelectrons.

* * * * *